United States Patent
Saji

(10) Patent No.: US 10,680,578 B2
(45) Date of Patent: Jun. 9, 2020

(54) ELASTIC WAVE DEVICE, FILTER, MULTIPLEXER, RADIO-FREQUENCY FRONT-END CIRCUIT, AND COMMUNICATION DEVICE

(71) Applicant: Murata Manufacturing Co., Ltd., Nagaokakyo-shi, Kyoto-fu (JP)

(72) Inventor: Mari Saji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/051,522

(22) Filed: Aug. 1, 2018

(65) Prior Publication Data

US 2019/0067551 A1 Feb. 28, 2019

(30) Foreign Application Priority Data

Aug. 28, 2017 (JP) .................... 2017-163054

(51) Int. Cl.
| | |
|---|---|
| *H03H 9/145* | (2006.01) |
| *H03H 9/64* | (2006.01) |
| *H03H 9/02* | (2006.01) |
| *H01L 41/08* | (2006.01) |
| *H03H 9/25* | (2006.01) |
| *H01L 41/187* | (2006.01) |
| *H03H 9/54* | (2006.01) |

(52) U.S. Cl.
CPC ......... *H03H 9/14541* (2013.01); *H01L 41/08* (2013.01); *H01L 41/1873* (2013.01); *H03H 9/02559* (2013.01); *H03H 9/02858* (2013.01); *H03H 9/25* (2013.01); *H03H 9/547* (2013.01); *H03H 9/6436* (2013.01); *H03H 9/6483* (2013.01)

(58) Field of Classification Search
CPC ... H01L 41/08; H01L 41/1873; H03H 9/6483; H03H 9/02559; H03H 9/6436; H03H 9/14541; H03H 9/547; H03H 9/02858; H03H 9/25
USPC .......................................... 333/133, 193–196
See application file for complete search history.

(56) References Cited

U.S. PATENT DOCUMENTS

| | | | |
|---|---|---|---|
| 2013/0026881 A1* | 1/2013 | Okamoto | H03H 9/0222 310/313 C |
| 2014/0285287 A1 | 9/2014 | Komatsu et al. | |
| 2015/0077194 A1* | 3/2015 | Ebihara | H03H 7/465 333/101 |

FOREIGN PATENT DOCUMENTS

JP 2014-187568 A 10/2014

* cited by examiner

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An elastic wave device includes a piezoelectric substrate and an interdigital transducer (IDT) electrode. The IDT electrode is disposed on the piezoelectric substrate and includes an electrode layer including molybdenum as a main component. The duty ratio of the IDT electrode is about 0.3 to about 0.48.

15 Claims, 14 Drawing Sheets

ELASTIC WAVE DEVICE, FILTER, MULTIPLEXER, RADIO-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-163054 filed on Aug. 28, 2017. The entire contents of this application are hereby incorporated herein by reference.

BACKGROUND OF THE INVENTION

1. Field of the Invention

The present invention relates to an elastic wave device, a filter, a multiplexer, a radio-frequency front-end circuit, and a communication device.

2. Description of the Related Art

An elastic wave device is widely used in a filter for a cellular phone, for example. Japanese Unexamined Patent Application Publication No. 2014-187568 discloses an example of an elastic wave device. This elastic wave device includes a piezoelectric substrate made of lithium niobate ($LiNbO_3$). On the piezoelectric substrate, an interdigital transducer (IDT) electrode is disposed. The IDT electrode is defined by a multilayer metal film including a molybdenum (Mo) layer and an aluminum (Al) layer stacked on each other. On the piezoelectric substrate, a dielectric film made of silicon dioxide ($SiO_2$) is disposed to cover the IDT electrode.

Japanese Unexamined Patent Application Publication No. 2014-187568 does not discuss the duty ratio of the IDT electrode. However, the frequency at which ripples at the upper edge of a stopband occur considerably varies depending on the value of the duty ratio. If the elastic wave device disclosed in Japanese Unexamined Patent Application Publication No. 2014-187568 is connected together with another filter to an antenna, ripples may also occur in the pass band of this filter. This may decrease the filter characteristics of this filter, such as the insertion loss.

SUMMARY OF THE INVENTION

Preferred embodiments of the present invention provide elastic wave devices, filters, multiplexers, radio-frequency front-end circuits, and communication devices that each reduce a variation in the frequency at which ripples at the upper edge of a stopband occur.

According to a preferred embodiment of the present invention, an elastic wave device includes a piezoelectric substrate and an interdigital transducer (IDT) electrode. The IDT electrode is disposed on the piezoelectric substrate and includes an electrode layer including molybdenum (Mo) as a main component. The duty ratio of the IDT electrode is about 0.3 to about 0.48.

In an elastic wave device according to a preferred embodiment of the present invention, the duty ratio of the IDT electrode may be about 0.475 or smaller. This configuration makes it possible to further reduce a variation in the frequency at which ripples at the upper edge of a stopband occur.

In an elastic wave device according to a preferred embodiment of the present invention, the duty ratio of the IDT electrode may be about 0.47 or smaller. This configuration makes it possible to further reduce a variation in the frequency at which ripples at the upper edge of a stopband occur.

An elastic wave device according to a preferred embodiment of the present invention may further include a dielectric film that is disposed on the piezoelectric substrate and that covers the IDT electrode. This configuration makes it possible to improve the temperature characteristics of velocity (temperature coefficient value TCV)).

In an elastic wave device according to a preferred embodiment of the present invention, the duty ratio of the IDT electrode may be about 0.44 to about 0.46. This configuration makes it possible to improve a trade-off relationship between the TCV and the fractional bandwidth.

In an elastic wave device according to a preferred embodiment of the present invention, the piezoelectric substrate may be made of lithium niobate, the dielectric film may be made of silicon oxide, and the elastic wave device may utilize Rayleigh waves which propagate through the piezoelectric substrate.

In an elastic wave device according to a preferred embodiment of the present invention, in a case in which a film thickness standardized by a wavelength which is determined by an electrode finger pitch of the IDT electrode is assumed as a standardized film thickness, the standardized film thickness of the dielectric film may be about 26% or greater. This configuration makes it possible to further reduce a variation in the frequency. This configuration is thus suitable for a duplexer having a narrow frequency interval.

In an elastic wave device according to a preferred embodiment of the present invention, in a case in which a film thickness standardized by a wavelength which is determined by an electrode finger pitch of the IDT electrode is assumed as a standardized film thickness, the standardized film thickness of the dielectric film may be about 37.5% or smaller. This configuration makes it possible to effectively reduce Sezawa waves.

According to a preferred embodiment of the present invention, a multiplexer includes an antenna terminal and first and second band pass filters. The antenna terminal is connected to an antenna. The first band pass filter is connected to the antenna terminal and includes an elastic wave device according to a preferred embodiment of the present invention. The second band pass filter is connected to the antenna terminal. The pass band of the second band pass filter is higher than that of the first band pass filter.

In a multiplexer according to a preferred embodiment of the present invention, the pass band of the first band pass filter may be a transmit band of Band3, and the pass band of the second band pass filter may be one of a transmit band and a receive band of Band1.

In a multiplexer according to a preferred embodiment of the present invention, the pass band of the first band pass filter may be a transmit band of Band66, and the pass band of the second band pass filter may be one of a transmit band and a receive band of Band25.

In a multiplexer according to a preferred embodiment of the present invention, there is provided a radio-frequency front-end circuit including the elastic wave device according to a preferred embodiment of the present invention and a power amplifier.

According to a preferred embodiment of the present invention, a radio-frequency front-end circuit includes a multiplexer according to a preferred embodiment of the present invention and a power amplifier.

According to a preferred embodiment of the present invention, a communication device includes a radio-frequency front-end circuit according to a preferred embodiment of the present invention and a radio-frequency signal processing circuit.

According to preferred embodiments of the present invention, it is possible to provide elastic wave devices, radio-frequency front-end circuits, and communication devices that each reduce a variation in the frequency at which ripples at the upper edge of a stopband occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the accompanying drawings.

The preferred embodiments disclosed in the specification are only examples. The configurations described in the different preferred embodiments may partially be replaced by or combined with each other.

Figure 1:
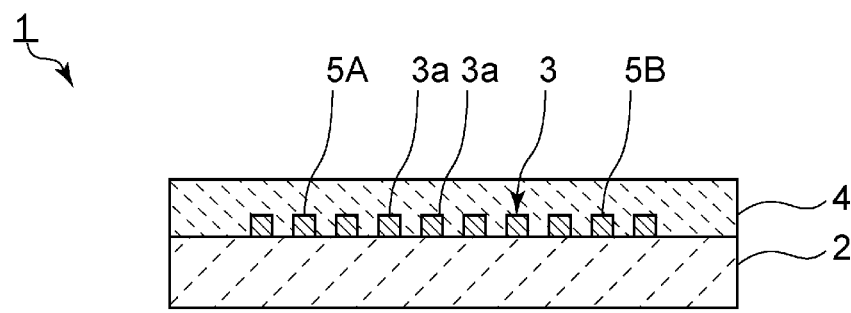
FIG. 1 is a front sectional view of an elastic wave device according to a first preferred embodiment of the present invention.

FIG. 1 is a front sectional view of an elastic wave device 1 according to a first preferred embodiment of the present invention.

The elastic wave device 1 includes a piezoelectric substrate 2 preferably made of lithium niobate (LiNbO$_3$), for example. In the first preferred embodiment, the Euler angles (φ, θ, ψ) of the piezoelectric substrate 2 are preferably (0°, 37.5°, 0°), for example. However, the Euler angles (φ, θ, ψ) are not restricted to these values. The material for the piezoelectric substrate 2 is not limited to LiNbO$_3$. The piezoelectric substrate 2 may be made of a piezoelectric single crystal of lithium tantalate (LiTaO$_3$), for example.

An interdigital transducer (IDT) electrode 3 is disposed on the piezoelectric substrate 2. By application of an alternating current (AC) voltage to the IDT electrode 3, elastic waves are excited. The IDT electrode 3 includes a plurality of electrode fingers 3a. The duty ratio of the IDT electrode 3 of the elastic wave device 1 is preferably about 0.3 to about 0.48, for example.

A reflector 5A is provided at one side of the IDT electrode 3 and a reflector 5B is provided at the other side of the IDT electrode 3 in the propagating direction of elastic waves. The elastic wave device 1 of the first preferred embodiment is a one-port elastic wave resonator.

In the first preferred embodiment, the IDT electrode 3 is preferably made of molybdenum (Mo), for example. Provided that the IDT electrode 3 includes an electrode layer including Mo as a main component, it may be defined by a multilayer metal film including this electrode layer and another metal layer stacked on each other. In the specification, including a certain element as a main component means that about 50 percentage by weight (wt %) or higher of this element is included. In the first preferred embodiment, the reflectors 5A and 5B are preferably made of a material the same as or similar to that of the IDT electrode 3.

On the piezoelectric substrate 2, a dielectric film 4 is provided to cover the IDT electrode 3. In the first preferred embodiment, the dielectric film 4 is preferably made of silicon dioxide ($SiO_2$), for example. As the material for the dielectric film 4, silicon oxide expressed by $SiO_x$ (x is real number) other than $SiO_2$ may be used. Alternatively, a material other than silicon oxide may be used for the dielectric film 4. A frequency adjusting film preferably made of silicon nitride (SiN), for example, may be provided on the dielectric film 4. Frequency adjustment is easily performed by adjusting the thickness of the frequency adjusting film.

The elastic wave device 1 of the first preferred embodiment preferably utilizes Rayleigh waves, for example. However, the elastic wave device 1 may utilize another type of elastic wave.

In the first preferred embodiment, preferably, the IDT electrode 3 disposed on the piezoelectric substrate 2 is made of Mo and the duty ratio of the IDT electrode 3 is about 0.3 to about 0.48. Because of these characteristics, a variation in the frequency at which ripples at the upper edge of a stopband occur are reduced. This will be explained below by comparing the first preferred embodiment with a comparative example. The configuration of an elastic wave device of the comparative example is similar to that of the first preferred embodiment, except that the duty ratio of the IDT electrode is greater than about 0.48. In the specification, ripples produced at the upper edge of a stopband will be referred to as stopband ripples.

Figure 2:
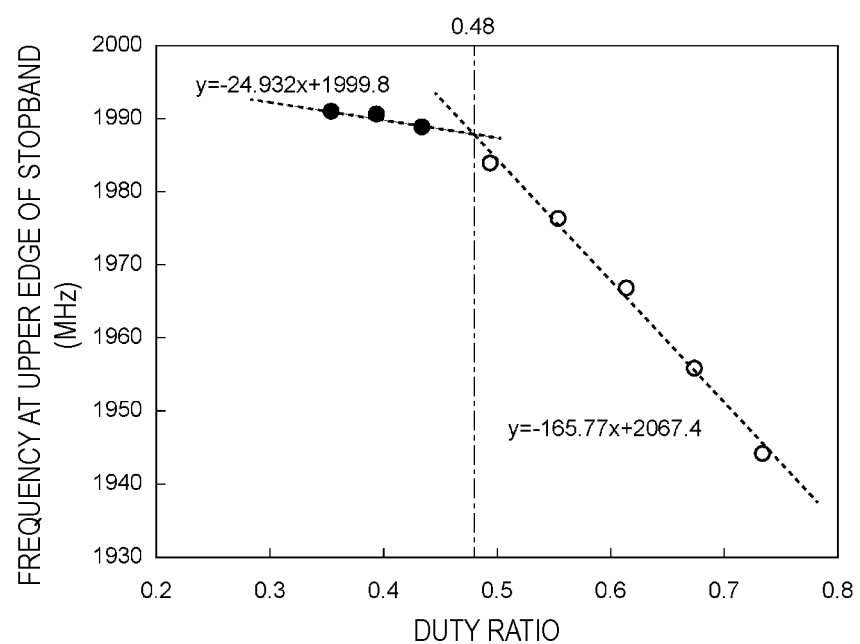
FIG. 2 is a graph illustrating the relationship between the duty ratio and the frequency at the upper edge of a stopband in the elastic wave device in the first preferred embodiment of the present invention and that in a comparative example.

FIG. 2 is a graph illustrating the relationship between the duty ratio and the frequency at the upper edge of a stopband in the elastic wave device 1 according to the first preferred embodiment and that in the comparative example. In FIG. 2, the black plots indicate the result of the first preferred embodiment, while the white plots indicate the result of the comparative example. The broken lines indicate the approximation of the result of the first preferred embodiment and that of the comparative example. In the equations in FIG. 2, y is the frequency at the upper edge of a stopband, and x is the duty ratio.

FIG. 2 shows that, in the comparative example, the frequency at the upper edge of a stopband changes by a greater amount in accordance with a change in the duty ratio. The slope represented by the coefficient of x in the equation is about −165.77. In contrast to the comparative example, in the first preferred embodiment in which the duty ratio is about 0.48 or smaller, the above-described slope is about −24.932 and a variation in the frequency at the upper edge of a stopband is much smaller than that of the comparative example. It is thus possible to reduce a variation in the frequency at which stopband ripples occur in the first preferred embodiment. Additionally, the duty ratio is about 0.3 or greater, and thus, the IDT electrode 3 is able to be easily obtained substantially without a defective portion.

Figure 3:
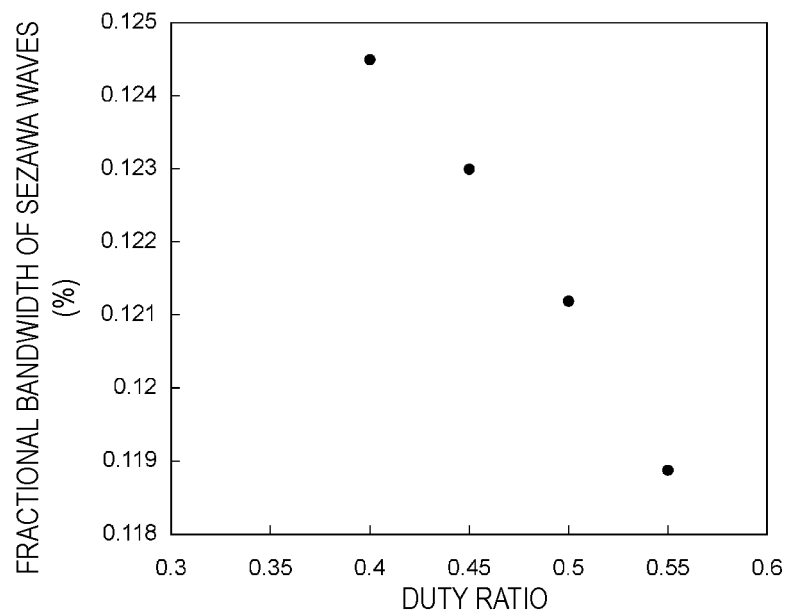
FIG. 3 is a graph illustrating the relationship between the duty ratio and the fractional bandwidth of Sezawa waves in an elastic wave device including an IDT electrode made of Cu.

In the first preferred embodiment, the IDT electrode 3 is preferably made of Mo, for example. If the IDT electrode is made of an element other than Mo, such as copper (Cu), for example, Sezawa waves, which are unwanted waves, are increased in accordance with a decrease in the duty ratio. This will be explained with reference to FIG. 3. It is assumed that the wavelength determined by the electrode finger pitch of an IDT electrode is indicated by λ, and the film thickness standardized by the wavelength λ is the standardized film thickness (%). The configuration of the elastic wave device from which the relationship shown in FIG. 3 is obtained is similar to that of the first preferred embodiment, except for the material of the IDT electrode. The standardized film thickness of the IDT electrode is preferably about 3% and that of the dielectric film is preferably about 34%, for example.

FIG. 3 is a graph illustrating the relationship between the duty ratio and the fractional bandwidth of Sezawa waves of the elastic wave device including an IDT electrode made of Cu.

FIG. 3 shows that, in the elastic wave device including a Cu IDT electrode, as the duty ratio is smaller, the fractional bandwidth of Sezawa waves is significantly increased. The fractional bandwidth of Sezawa waves is about 0.118% or greater in the range shown in FIG. 3. If an elastic wave device including a Cu IDT electrode having a smaller duty ratio is connected together with another band pass filter to an antenna, the filter characteristics of this band pass filter, such as the insertion loss, may be decreased.

Figure 4:
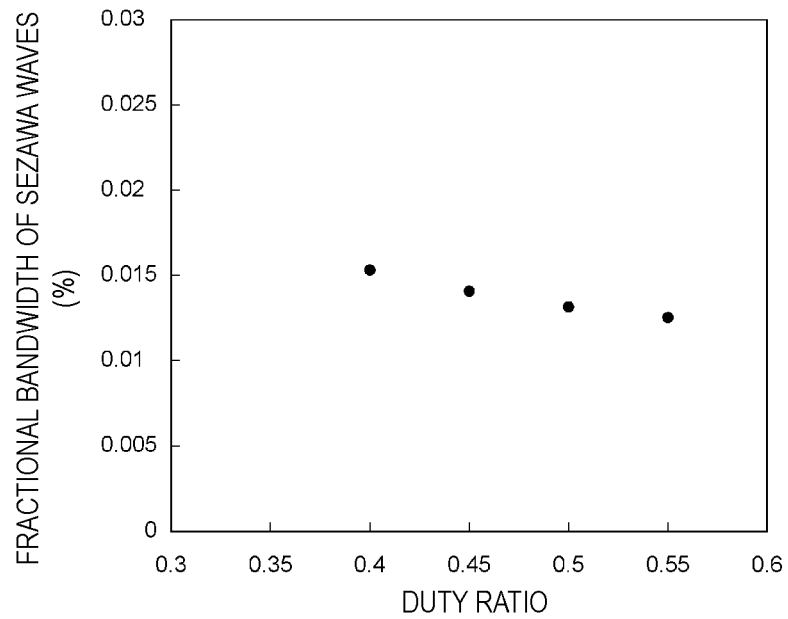
FIG. 4 is a graph illustrating the relationship between the duty ratio and the fractional bandwidth of Sezawa waves in an elastic wave device including an IDT electrode made of Mo.

The relationship between the duty ratio and the fractional bandwidth of Sezawa waves of an elastic wave device including an IDT electrode made of Mo is shown in FIG. 4. The configuration of the elastic wave device from which the relationship shown in FIG. 4 is obtained is similar to that of the elastic wave device 1 of the first preferred embodiment when the duty ratio of this elastic wave device is about 0.48 or smaller and is similar to that of the above-described comparative example when the duty ratio of this elastic wave device is greater than about 0.48. The standardized film thickness of the IDT electrode is preferably about 5%, and that of the dielectric film is preferably about 34%, for example.

FIG. 4 is a graph illustrating the relationship between the duty ratio and the fractional bandwidth of Sezawa waves in the elastic wave device including a Mo IDT electrode.

FIG. 4 shows that, in the elastic wave device including a Mo IDT electrode, a variation in the fractional bandwidth of Sezawa waves with respect to a change in the duty ratio is small. The fractional bandwidth of Sezawa waves is less than about 0.02% in the range shown in FIG. 4. When the elastic wave device 1 of the first preferred embodiment is connected together with another band pass filter to an antenna, the influence of Sezawa waves on this band pass filter is very small.

The dimension of the electrode fingers 3a of the IDT electrode 3 shown in FIG. 1 in the propagating direction of elastic waves will be referred to as the electrode finger width. In actual products, manufacturing variations occur in the electrode finger width of the IDT electrode 3. This causes a frequency variation in the elastic wave device 1. In the first preferred embodiment, the dielectric film 4 is provided on the piezoelectric substrate 2 and covers the IDT electrode 3.

Figure 5:
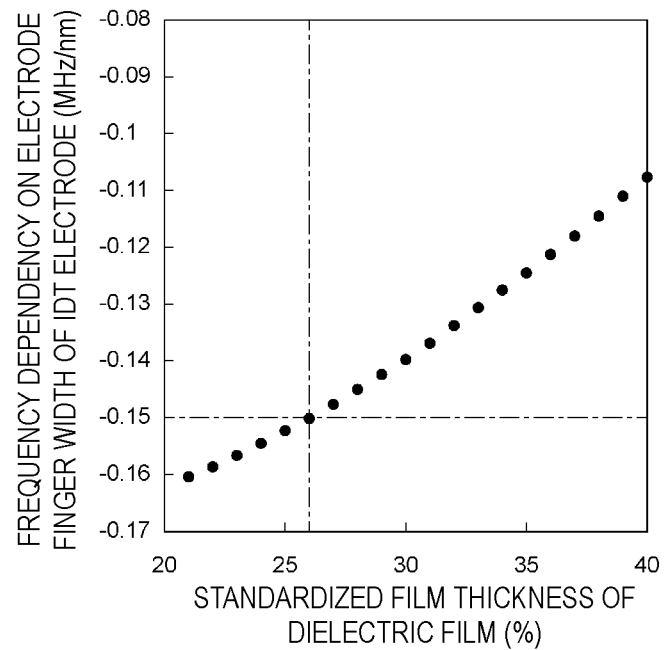
FIG. 5 is a graph illustrating the relationship between the standardized film thickness of a dielectric film and the frequency dependency on the electrode finger width of an IDT electrode.
Figure 7:
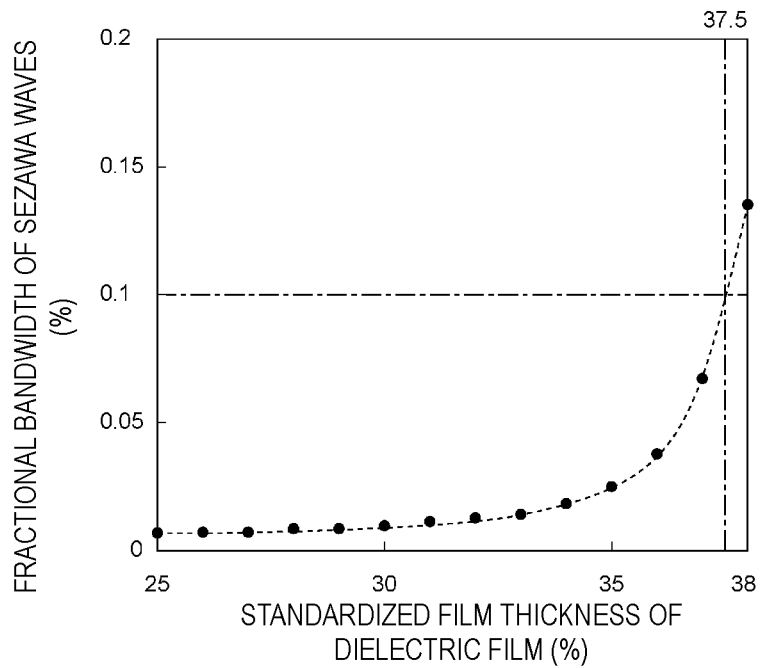
FIG. 7 is a graph illustrating the relationship between the standardized film thickness of a dielectric film and the fractional bandwidth of Sezawa waves.

This reduces the dependency of the frequency on the electrode finger width, thus decreasing the frequency variation. However, if the standardized film thickness of the dielectric film is excessively thick, the fractional bandwidth of Sezawa waves is increased. This will be explained with reference to FIGS. 5 and 7. The configuration of the elastic wave device from which the relationships shown in FIGS. 5 and 7 are obtained is similar to that of the first preferred embodiment. The standardized film thickness of the IDT electrode is about 5%, for example.

FIG. 5 is a graph illustrating the relationship between the standardized film thickness of the dielectric film and the frequency dependency on the electrode finger width of the IDT electrode.

FIG. 5 shows that, as the standardized film thickness of the dielectric film is thicker, the absolute value of the frequency dependency on the electrode finger width of the IDT electrode becomes smaller. The standardized film thickness of the dielectric film is preferably about 26% or greater, for example. This enables the absolute value of the frequency dependency on the electrode finger width to be about 0.15 MHz/nm or smaller, for example, thus further decreasing the frequency variation.

If the absolute value of the frequency dependency on the electrode finger width of the IDT electrode is about 0.15 MHz/nm or smaller, for a variation of about 10 nm in the electrode finger width, for example, between about 0.43 μm and about 0.44 μm, the frequency variation is maintained at about 1.5 MHz or smaller. When the elastic wave device 1 of the first preferred embodiment is applied to a duplexer, a variation in the frequency characteristics is able to be reduced, thus improving the yield of the duplexer and a surface acoustic wave (SAW) device including the duplexer. This will be described below with reference to an example in which the elastic wave device 1 of the first preferred embodiment is applied to a Band3 duplexer.

The duplexer includes a first band pass filter having a first pass band and a second band pass filter having a second pass band. The first and second pass bands are different from each other. The first pass band is preferably the transmit band of Band3 and is about 1710 MHz to about 1785 MHz, for example. The second pass band is preferably the receive band of Band3 and is about 1805 MHz to about 1880 MHz, for example. A description will be provided below, assuming that the elastic wave device 1 is applied to the first and second band pass filters.

The range between the highest frequency of the transmit band of Band3 and the lowest frequency of the receive band of Band3 is as narrow as about 20 MHz. To manufacture a Band3 duplexer, the total variation of a frequency variation due to the sharpness of a filter, that due to a temperature change, and that due to the manufacturing variations is preferably maintained within about 20 MHz.

Figure 6:
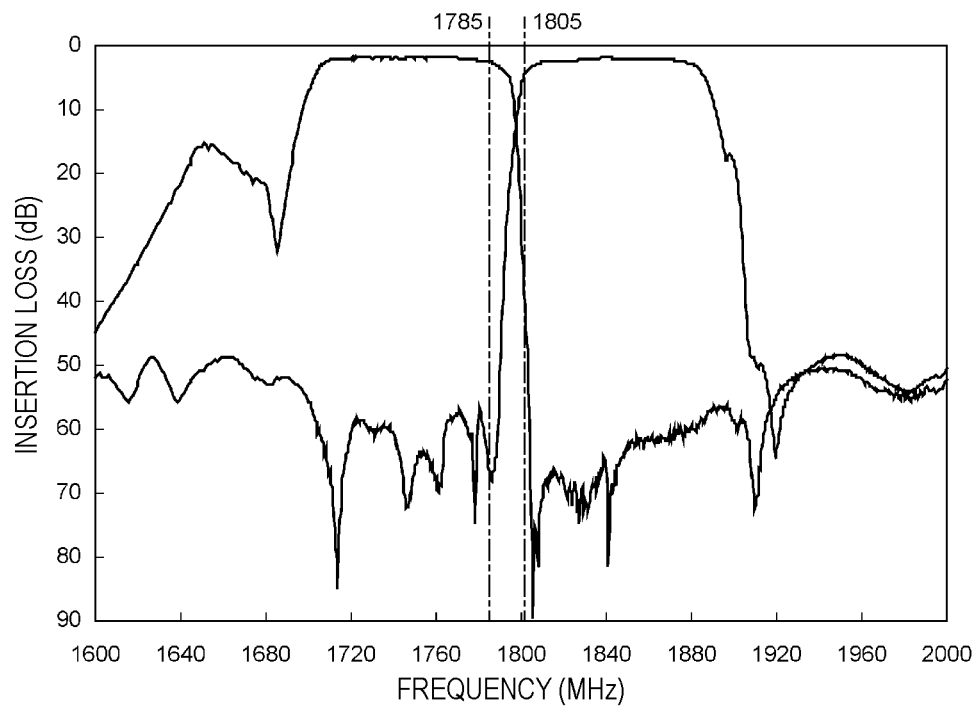
FIG. 6 is a graph illustrating the attenuation-frequency characteristics of an example of a duplexer including the elastic wave device of the first preferred embodiment of the present invention.

FIG. 6 is a graph illustrating the attenuation-frequency characteristics of an example of a duplexer including the elastic wave device 1 of the first preferred embodiment.

The difference between one of the highest frequency and the lowest frequency of the pass band of a first band pass filter which is closer to the pass band of a second band pass filter and the frequency at which the isolation between the two band pass filters is about −50 dB will be referred to as the sharpness of the first band pass filter. In the above-described duplexer, one of the highest frequency and the lowest frequency of the first pass band which is closer to the second pass band is about 1785 MHz. The frequency at which the isolation between the first and second band pass filters is about −50 dB is about 1800 MHz. Accordingly, the sharpness of the first band pass filter is about 15 MHz.

The frequency variation due to a temperature change is assumed to be about 1 MHz, for example. This frequency variation is produced by both of the first and second band pass filters. The frequency variation thus results in about 1 MHz×2.

When the frequency variation due to the manufacturing variations in the electrode finger width of the first band pass filter and that of the second band pass filter are each indicated by X MHz, it is preferable to satisfy the following expression 1 to manufacture a Band3 duplexer.

20 MHz 15 MHz (sharpness)+1 MHz (frequency variation due to a temperature variation)×2+X MHz (manufacturing frequency variation)×2

By applying the elastic wave device 1 of the first preferred embodiment to the first and second band pass filters, the frequency variation X due to the manufacturing variations in the electrode finger width is able to be regulated to be about 1.5 MHz or smaller. As a result, duplexers having a communication band with a frequency interval of about 20 MHz or greater are able to be manufactured with a high yield. The frequency interval is a frequency difference between one of the highest frequency and the lowest frequency of a first pass band which is closer to a second pass band and one of the highest frequency and the lowest frequency of the second pass band which is closer to the first pass band.

FIG. 7 is a graph illustrating the relationship between the standardized film thickness of the dielectric film and the fractional bandwidth of Sezawa waves.

Figure 8:
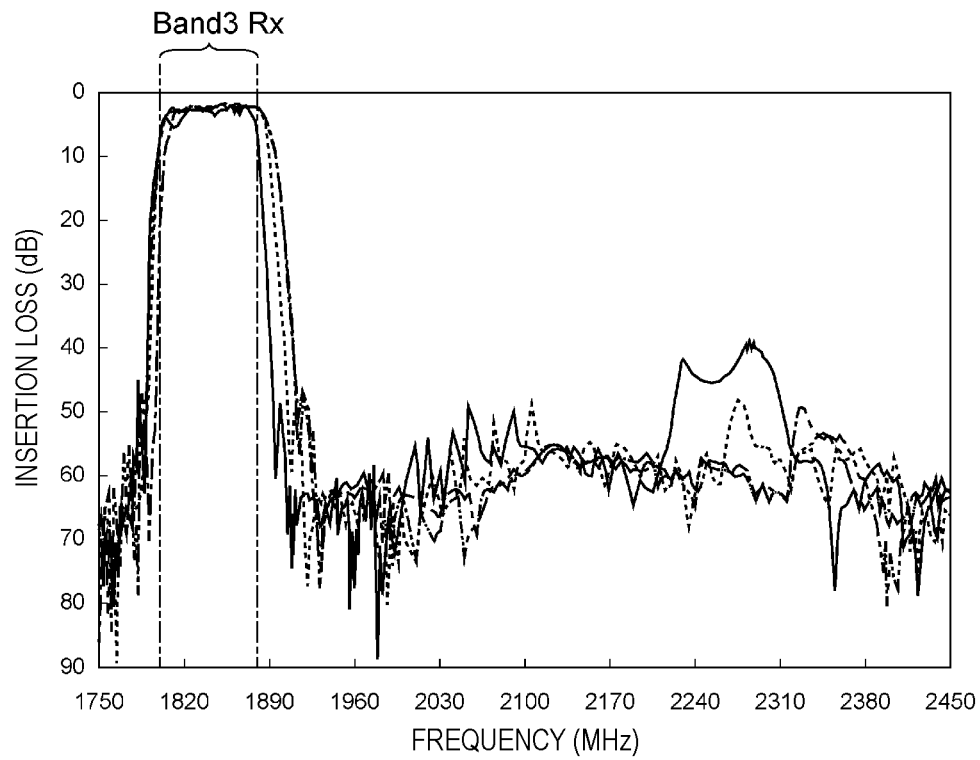
FIG. 8 is a graph illustrating the relationship between the fractional bandwidth of Sezawa waves and the attenuation-frequency characteristics.

FIG. 7 shows that, as the standardized film thickness of the dielectric film increases, the fractional bandwidth of Sezawa waves is increased. The standardized film thickness of the dielectric film is preferably about 37.5% or smaller, for example, thus reducing the fractional bandwidth of Sezawa waves to be smaller than about 0.1%. Sezawa waves are thus sufficiently reduced. This will be explained with reference to FIG. 8. The attenuation-frequency characteristics of a plurality of Band3 receive filters having different fractional bandwidths of Sezawa waves are shown in FIG. 8. The respective fractional bandwidths of Sezawa waves of the Band3 receive filters are about 0.3%, about 0.098%, about 0.012%, and about 0.005%, for example.

FIG. 8 is a graph illustrating the relationship between the fractional bandwidth of Sezawa waves and the attenuation-frequency characteristics. In FIG. 8, the solid line indicates the attenuation-frequency characteristics when the fractional bandwidth of Sezawa waves is about 0.3%, the broken line indicates those when the fractional bandwidth of Sezawa waves is about 0.098%, the long dashed dotted line indicates those when the fractional bandwidth of Sezawa waves is about 0.012%, and the long dashed double-dotted line indicates those when the fractional bandwidth of Sezawa waves is about 0.005%.

FIG. 8 shows that, when the fractional bandwidth of Sezawa waves is about 0.3%, Sezawa waves are not sufficiently reduced in a range of about 2240 MHz to about 2300 MHz. In contrast, when the fractional bandwidth of Sezawa waves is smaller than about 0.1%, Sezawa waves are reduced to about −45 dB in this range.

As shown in FIG. 3, when using the IDT electrode made of Cu, even when the standardized film thickness of the dielectric film is about 34%, Sezawa waves are not sufficiently reduced. As in the first preferred embodiment, by including an electrode layer including Mo as a main component, the duty ratio of the IDT electrode is about 0.48 or smaller without increasing the fractional bandwidth of Sezawa waves. It is thus possible to reduce Sezawa waves and also to decrease a variation in the frequency at which stopband ripples occur in the first preferred embodiment.

Figure 9:
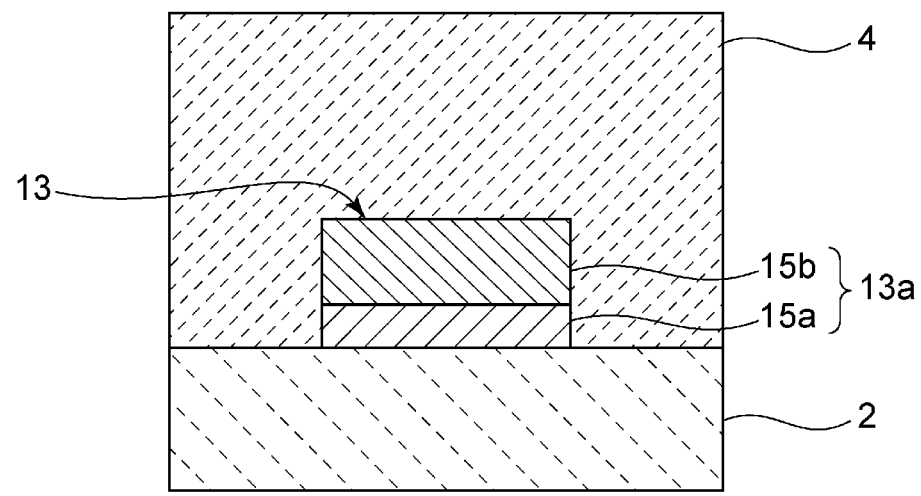
FIG. 9 is an enlarged front sectional view of an electrode finger of an IDT electrode according to a modified example of the first preferred embodiment of the present invention.

FIG. 9 is an enlarged front sectional view of an electrode finger 13a of an IDT electrode 13 according to a modified example of the first preferred embodiment.

The electrode finger 13a of the IDT electrode 13 includes a first electrode layer 15a disposed on a piezoelectric substrate 2 and a second electrode layer 15b disposed on the first electrode layer 15a. The IDT electrode 13 is defined by a multilayer metal film including the first and second electrode layers 15a and 15b stacked on each other. The first electrode layer 15a is preferably made of Mo, and the second electrode layer 15b is preferably made of Al, for example. The electrical resistance of Al is lower than that of Mo. The provision of the second electrode layer 15b thus reduces the electrical resistance of the IDT electrode 13.

Band pass filters according to second through fifth preferred embodiments of the present invention will be described below. The band pass filters according to the second through fifth preferred embodiments each include an elastic wave resonator configured in accordance with the elastic wave device 1 of the first preferred embodiment, thus reducing a variation in the frequency at which stopband ripples occur. When a band pass filter according to a preferred embodiment of the present invention is connected together with another band pass filter to an antenna, the filter characteristics of this band pass filter, such as the insertion loss, is less likely to be decreased.

Figure 10:
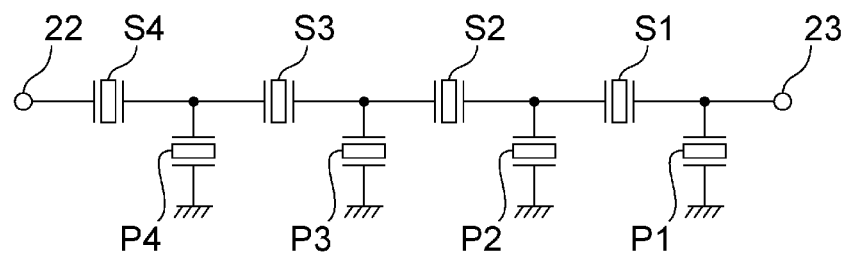
FIG. 10 is a circuit diagram of a band pass filter according to a second preferred embodiment of the present invention.

FIG. 10 is a circuit diagram of a band pass filter 21A according to the second preferred embodiment.

The band pass filter 21A includes a plurality of elastic wave resonators. More specifically, the band pass filter 21A is preferably a ladder filter, for example, including series arm resonators S1 through S4 and parallel arm resonators P1 through P4. In the second preferred embodiment, the series arm resonator S4 is configured in accordance with the elastic wave device 1 of the first preferred embodiment. It is sufficient that at least one of the plurality of elastic wave resonators of the band pass filter 21A is configured in accordance with an elastic wave resonator according to a preferred embodiment of the present invention.

The band pass filter 21A includes a signal terminal 23 and an antenna terminal 22 which is connected to an antenna. The series arm resonators S1 through S4 are connected in series with each other between the signal terminal 23 and the antenna terminal 22. The parallel arm resonator P1 is connected between a ground potential and a node between the signal terminal 23 and the series arm resonator S1. The parallel arm resonator P2 is connected between a ground potential and a node between the series arm resonators S1 and S2. The parallel arm resonator P3 is connected between a ground potential and a node between the series arm resonators S2 and S3. The parallel arm resonator P4 is connected between a ground potential and a node between the series arm resonators S3 and S4.

The return loss at the antenna terminal 22 of the band pass filter 21A is maximized in response to higher-order modes generated from the series arm resonator S4 located closest to the antenna terminal 22. It is thus preferable that, as in the second preferred embodiment, the elastic wave resonator located closest to the antenna terminal 22 is configured in accordance with the elastic wave device 1 of the first preferred embodiment. Then, when the band pass filter 21A is connected together with another band pass filter to an antenna, the influence of stopband ripples on this band pass filter is further reduced.

Figure 11:
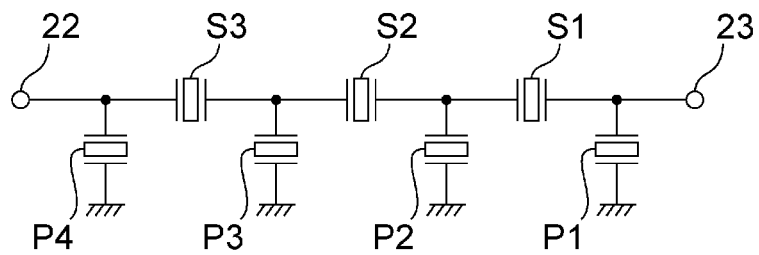
FIG. 11 is a circuit diagram of a band pass filter according to a third preferred embodiment of the present invention.

FIG. 11 is a circuit diagram of a band pass filter 21B according to the third preferred embodiment.

The band pass filter 21B of the third preferred embodiment is different from the band pass filter 21A of the second preferred embodiment in that the series arm resonator S4 is not provided and the parallel arm resonator P4 is configured in accordance with the elastic wave device 1 of the first preferred embodiment. Except for this point, the configuration of the band pass filter 21B of the third preferred embodiment is the same or similar to that of the band pass filter 21A of the second preferred embodiment.

The return loss at the antenna terminal 22 of the band pass filter 21B is maximized in response to higher-order modes generated from the parallel arm resonator P4 located closest to the antenna terminal 22. By configuring the parallel arm resonator P4 as in the elastic wave device 1 of the first preferred embodiment, when the band pass filter 21B is connected together with another band pass filter to an antenna, the influence of stopband ripples on this band pass filter is further reduced. As is seen from the second and third preferred embodiments, regardless of whether the elastic wave resonator located closest to the antenna device 22 and configured in accordance with the elastic wave device 1 of the first preferred embodiment is a series arm resonator or a parallel arm resonator, the above-described advantages are obtained.

Figure 12:
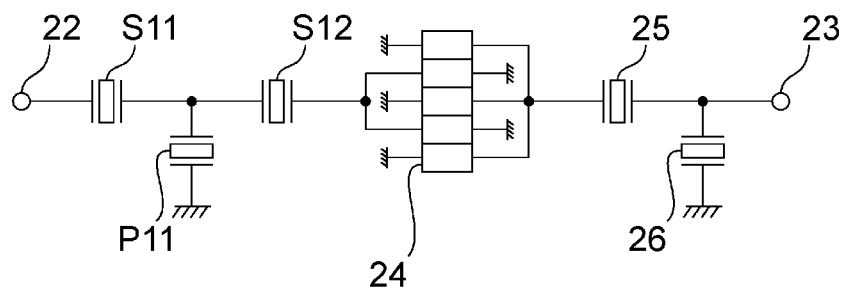
FIG. 12 is a circuit diagram of a band pass filter according to a fourth preferred embodiment of the present invention.

FIG. 12 is a circuit diagram of a band pass filter 21C according to the fourth preferred embodiment.

The band pass filter 21C preferably includes a longitudinally coupled resonator elastic wave filter 24, for example, disposed between an antenna terminal 22 and a signal terminal 23. A ladder filter including series arm resonators S11 and S12 and a parallel arm resonator P11 is connected between the antenna terminal 22 and the longitudinally coupled resonator elastic wave filter 24.

More specifically, the series arm resonators S11 and S12 are connected in series with each other between the antenna terminal 22 and the longitudinally coupled resonator elastic wave filter 24. The parallel arm resonator P11 is connected between a ground potential and a node between the series arm resonators S11 and S12. In the fourth preferred embodiment, the series arm resonator S11 is configured in accordance with the elastic wave device 1 of the first preferred embodiment.

An elastic wave resonator 25 is connected between the longitudinally coupled resonator elastic wave filter 24 and the signal terminal 23. An elastic wave resonator 26 is connected between a ground potential and a node between the elastic wave resonator 25 and the signal terminal 23. The elastic wave resonators 25 and 26 are used to adjust the characteristics of the band pass filter 21C.

Although in the fourth preferred embodiment, the longitudinally coupled resonator elastic wave filter 24 is preferably a 5IDT elastic wave filter, for example, it may have any number of IDT electrodes. For example, the longitudinally coupled resonator elastic wave filter 24 may be a 3IDT or 7IDT elastic wave resonator.

Figure 13:
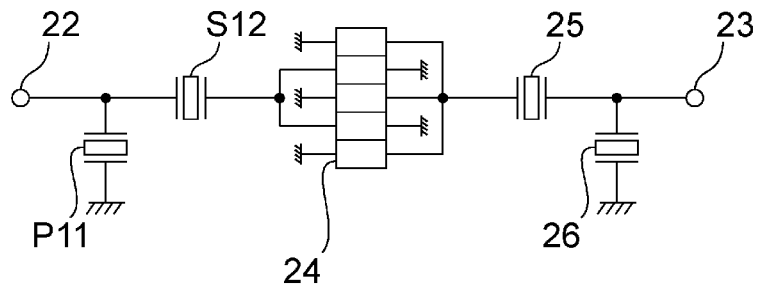
FIG. 13 is a circuit diagram of a band pass filter according to a fifth preferred embodiment of the present invention.

FIG. 13 is a circuit diagram of a band pass filter 21D according to the fifth preferred embodiment.

The band pass filter 21D is different from the band pass filter 21C of the fourth preferred embodiment in that the series arm resonator S11 is not provided and the parallel arm resonator P11 is configured in accordance with the elastic wave device 1 of the first preferred embodiment. Except for this point, the configuration of the band pass filter 21D is the same or similar to that of the band pass filter 21C of the fourth preferred embodiment.

Figure 14:
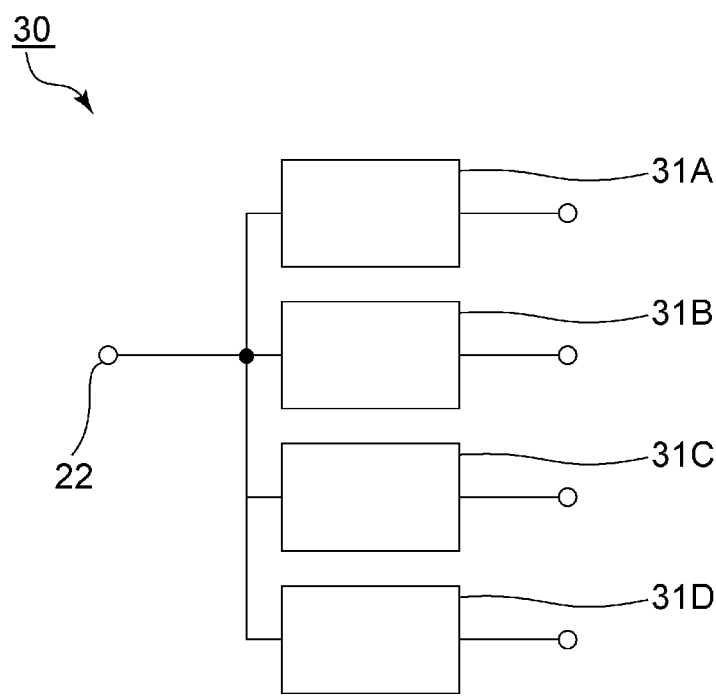
FIG. 14 is a schematic view of a quadplexer according to a sixth preferred embodiment of the present invention.

FIG. 14 is a schematic view of a quadplexer 30 according to a sixth preferred embodiment of the present invention.

The quadplexer 30 includes an antenna terminal 22 and first through fourth band pass filters 31A through 31D connected to the antenna terminal 22. The first band pass filter 31A is similar to the band pass filter 21A shown in FIG. 10, and the series arm resonator S4 located closest to the antenna terminal 22 is configured in accordance with the elastic wave device 1 of the first preferred embodiment.

The circuit configuration of the first band pass filter 31A is not restricted to a particular configuration, provided that the first band pass filter 31A includes an elastic wave resonator configured similarly to the elastic wave device 1 of the first preferred embodiment. The circuit configurations of the second through fourth band pass filters 31B through 31D are also not limited to a particular configuration.

The pass band of the first band pass filter 31A is preferably the transmit band of Band3 and is about 1710 MHz to about 1785 MHz, for example. The pass band of the second band pass filter 31B is preferably the transmit band of Band1 and is about 1920 MHz to about 1980 MHz, for example. The pass band of the third band pass filter 31C is preferably the receive band of Band3 and is about 1805 MHz to about 1880 MHz, for example. The pass band of the fourth band pass filter 31D is preferably the receive band of Band1 and is about 2110 MH to about 2170 MHz, for example. The pass band of the second band pass filter 31B may be any range of frequency which is higher than that of the first band pass filter 31A and may be the receive band of Band1. The pass bands of the first through fourth band pass filters 31A through 31D are not restricted to the above-described frequency ranges.

Figure 15:
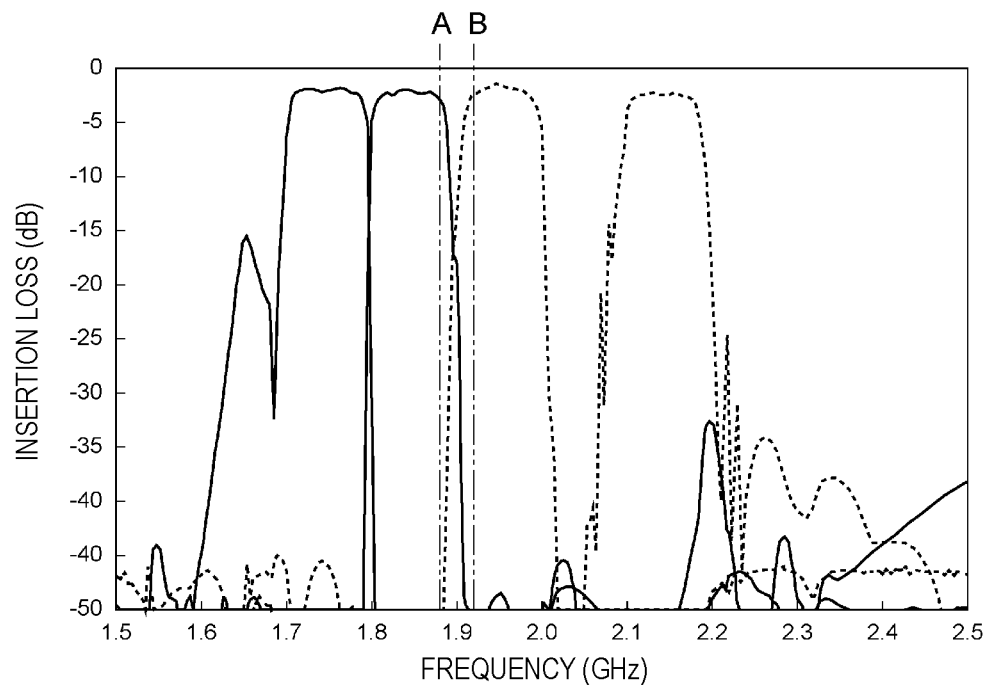
FIG. 15 is a graph illustrating the attenuation-frequency characteristics of first through fourth band pass filters of the sixth preferred embodiment of the present invention.
Figure 16:
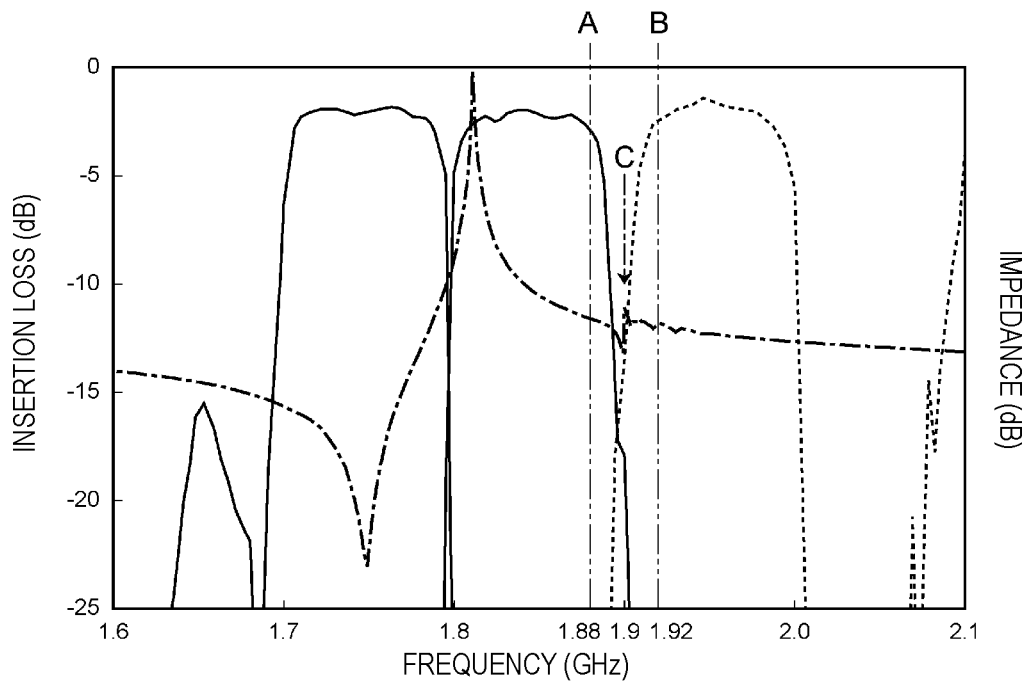
FIG. 16 is a graph in which a diagram illustrating impedance characteristics of a series arm resonator of the first band pass filter of the sixth preferred embodiment of the present invention and an enlarged diagram of FIG. 15 are superposed on each other.

FIG. 15 is a graph illustrating the attenuation-frequency characteristics of the first through fourth band pass filters 31A through 31D of the sixth preferred embodiment. FIG. 16 is a graph in which a diagram illustrating the impedance characteristics of the series arm resonator of the first band pass filter 31A of the sixth preferred embodiment and an enlarged diagram of FIG. 15 are superposed on each other. In FIGS. 15 and 16, the solid lines indicate the attenuation-frequency characteristics of the first and third band pass filters 31A and 31C, while the broken lines indicate the attenuation-frequency characteristics of the second and fourth band pass filters 31B and 31D. The long dashed dotted line in FIG. 16 indicates the impedance characteristics of the series arm resonator of the first band pass filter 31A. In FIGS. 15 and 16, the long dashed double-dotted line A indicates the highest frequency of the pass band of the third band pass filter 31C, while the long dashed double-dotted line B indicates the lowest frequency of the pass band of the second band pass filter 31B.

In the series arm resonator of the first band pass filter 31A, a stopband ripple occurs at a position indicated by the arrow C in FIG. 16, for example. This ripple is positioned between the long dashed double-dotted lines A and B, and no ripples occur in any range of the pass bands of the second and third band pass filters 31B and 31C. It is thus less likely that the filter characteristics will be decreased.

In the sixth preferred embodiment, the first band pass filter 31A includes a series arm resonator configured in accordance with the elastic wave device 1 of the first preferred embodiment. It is thus possible to reduce a variation in the frequency at which stopband ripples occur, such as that the frequency at which ripples occur is restricted to that positioned between the long dashed double-dotted lines A and B, thus effectively reducing or preventing the degradation of the filter characteristics.

The duty ratio of the IDT electrode of the series arm resonator of the first band pass filter 31A is preferably about 0.475 or smaller, for example. This further reduces or prevents the degradation of the filter characteristics. This will be explained with reference to FIGS. 17 and 18. To determine the relationships shown in FIGS. 17 and 18, the duty ratio of the IDT electrode of an elastic wave resonator configured similarly to the elastic wave device 1 of the first preferred embodiment is varied.

Figure 17:
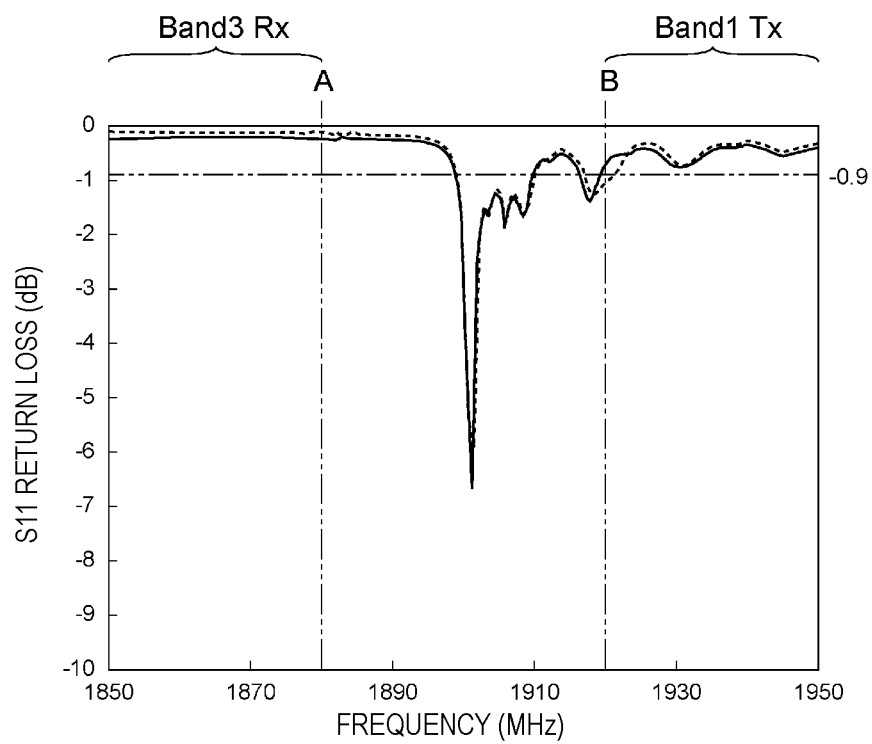
FIG. 17 is a graph illustrating the return loss caused by stopband ripples when the duty ratio of the IDT electrode of an elastic wave resonator is about 0.475 and about 0.48.
Figure 18:
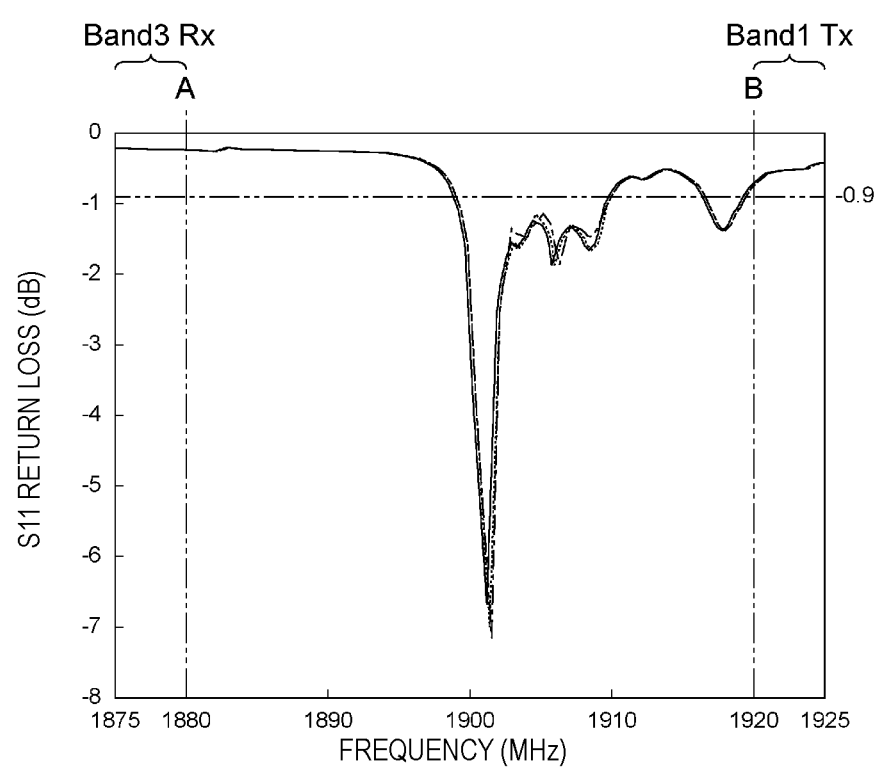
FIG. 18 is a graph illustrating the return loss caused by stopband ripples when the duty ratio of the IDT electrode of an elastic wave resonator is about 0.405, about 0.44, and about 0.475.

FIG. 17 is a graph illustrating the return loss caused by stopband ripples when the duty ratio of the IDT electrode of the elastic wave resonator is about 0.475 and about 0.48. FIG. 18 is a graph illustrating the return loss caused by stopband ripples when the duty ratio of the IDT electrode of the elastic wave resonator is about 0.405, about 0.44, and about 0.475. In FIG. 17, the solid line indicates the return loss when the duty ratio is about 0.475, while the broken line indicates the return loss when the duty ratio is about 0.48. In FIG. 18, the solid line indicates the return loss when the duty ratio is about 0.475, the broken line indicates the return loss when the duty ratio is about 0.44, and the long dashed dotted line indicates the return loss when the duty ratio is about 0.405.

FIG. 17 shows that, when the duty ratio of the IDT electrode is about 0.48, the largest peak of the stopband ripple is positioned between the receive band of Band3 and the transmit band of Band1. Thus, the filter characteristics are not significantly decreased. When the duty ratio is about 0.475, the absolute value of the return loss in the receive band of Band3 and the transmit band of Band1 is smaller than about 0.9, thus further reducing or preventing the degradation of the filter characteristics. FIG. 18 shows that, when the duty ratio is smaller than about 0.475, the absolute value of the return loss in the receive band of Band3 and the transmit band of Band1 is smaller than about 0.9. Thus, setting of the duty ratio of about 0.475 or smaller further reduces the degradation of the filter characteristics.

If the manufacturing variations in the electrode finger width of the IDT electrode are about ±7%, the duty ratio varies by about ±0.035. If the target duty ratio of the IDT electrode is about 0.44, the duty ratio varies within a range of about 0.44± about 0.035. When the duty ratio of the IDT electrode of the elastic wave resonator varies within this range, stopband ripples appear, as shown in FIG. 18.

Figure 19:
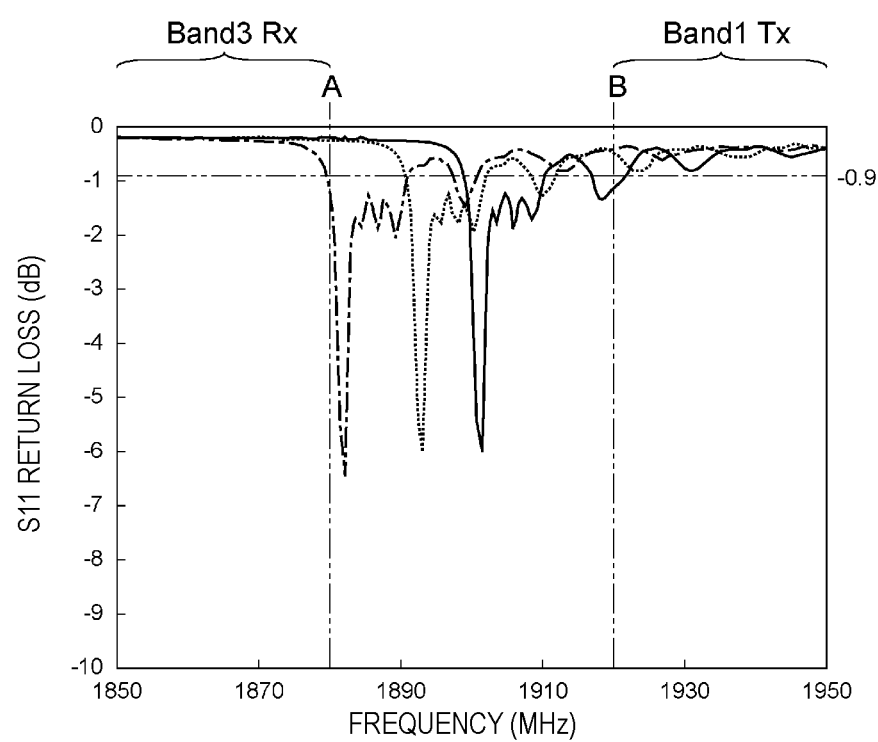
FIG. 19 is a graph illustrating the return loss caused by stopband ripples when the duty ratio of the IDT electrode of an elastic wave resonator is about 0.48, about 0.515, and about 0.55.

If the target duty ratio of the IDT electrode is about 0.515, the duty ratio varies within a range of about 0.515± about 0.035. In this case, stopband ripples appear, as shown in FIG. 19. The elastic wave resonator from which the relationship shown in FIG. 19 is obtained is similar to that of the elastic wave device 1 of the first preferred embodiment when the duty ratio of this elastic wave resonator is about 0.48 and is similar to that of the above-described comparative example when the duty ratio of this elastic wave resonator is greater than about 0.48.

FIG. 19 is a graph illustrating the return loss caused by stopband ripples when the duty ratio of the IDT electrode of the elastic wave resonator is about 0.48, about 0.515, and about 0.55. In FIG. 19, the solid line indicates the return loss when the duty ratio is about 0.48, the broken line indicates the return loss when the duty ratio is about 0.515, and the long dashed dotted line indicates the return loss when the duty ratio is about 0.55.

FIG. 19 shows that, when the target value of the duty ratio of the IDT electrode is about 0.515, which is greater than about 0.48, the frequency at which stopband ripples occur significantly varies. In contrast, FIG. 18 shows that, when the target value of the duty ratio of the IDT electrode is about 0.44, which is smaller than about 0.48, a variation in the frequency at which stopband ripples occur is effectively reduced. Additionally, when the duty ratio is about 0.44± about 0.035, the absolute value of the return loss in the receive band of Band3 and the transmit band of Band1 is smaller than about 0.9.

In the first band pass filter 31A shown in FIG. 14, therefore, the target value of the duty ratio of the IDT electrode of the series arm resonator configured in accordance with the first preferred embodiment is preferably set to be about 0.44 or smaller, for example. As shown in FIG. 15, for example, the bandwidth between the highest frequency of the receive band of Band3 and the lowest frequency of the transmit band of Band1 is as narrow as about 40 MHz. In this case, by setting the target value of the duty ratio to be about 0.44 or smaller, it is possible to reduce a variation in the frequency at which stopband ripples occur and also to restrict this frequency range to between the highest frequency of the receive band of Band3 and the lowest frequency of the transmit band of Band1. It is thus possible to effectively reduce or prevent the degradation of the filter characteristics, such as the insertion loss, of the third band pass filter 31C using the receive band of Band3 as the pass band and the second band pass filter 31B using the transmit band of Band1 as the pass band.

The preferable duty ratio of the IDT electrode differs according to the pass band of a band pass filter to be used. In a quadplexer using the transmit band and the receive band of Band66 and those of Band25 as the pass bands, for example, the duty ratio is preferably about 0.47 or smaller. This will be explained below.

In a quadplexer according to a seventh preferred embodiment of the present invention, the pass bands of band pass filters are different from those of the quadplexer 30 of the sixth preferred embodiment. Except for this point, the configuration of the quadplexer of the seventh preferred embodiment is the same or similar to that of the quadplexer 30 of the sixth preferred embodiment.

The pass band of a first band pass filter is preferably the transmit band of Band66 and is about 1710 MHz to about 1780 MHz, for example. The pass band of a second band pass filter is preferably the transmit band of Band25 and is about 1850 MHz to about 1915 MHz, for example. The pass band of a third band pass filter is preferably the receive band of Band66 and is about 2110 MHz to about 2200 MHz, for example. The pass band of a fourth band pass filter is preferably the receive band of Band25 and is about 1930 MHz to about 1995 MHz, for example. The pass band of the second band pass filter may be the receive band of Band25.

In the seventh preferred embodiment, in the first band pass filter, stopband ripples occur near the bandwidth between the transmit band and the receive band of Band25.

In the seventh preferred embodiment, by setting the duty ratio of the IDT electrode of the series arm resonator configured in accordance with the first preferred embodiment of the first band pass filter to be about 0.47 or smaller, for example, the degradation of the filter characteristics is effectively reduced or prevented. This will be explained with reference to FIG. 20. The configuration of the elastic wave resonator from which the relationship shown in FIG. 20 is obtained is similar to that of the first preferred embodiment.

Figure 20:
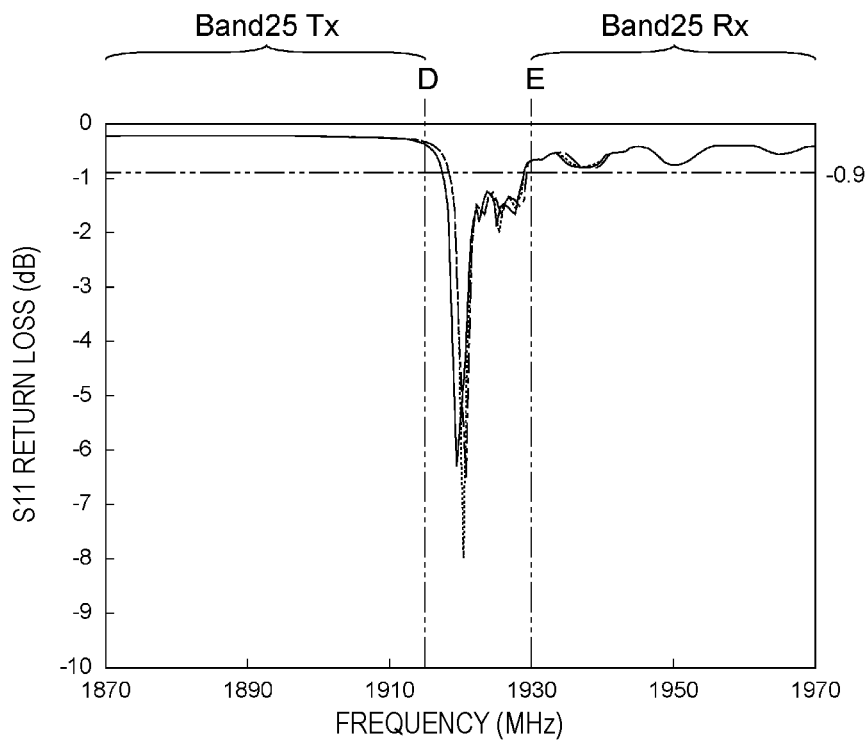
FIG. 20 is a graph illustrating the return loss caused by stopband ripples when the duty ratio of the IDT electrode of an elastic wave resonator is about 0.4, about 0.435, and about 0.47.

FIG. 20 is a graph illustrating the return loss caused by stopband ripples when the duty ratio of the IDT electrode of the elastic wave resonator is about 0.4, about 0.435, and about 0.47. In FIG. 20, the solid line indicates the return loss when the duty ratio is about 0.47, the broken line indicates the return loss when the duty ratio is about 0.435, and the long dashed dotted line indicates the return loss when the duty ratio is about 0.4. The long dashed double-dotted line D indicates the highest frequency of the pass band of the second band pass filter, while the long dashed double-dotted line E indicates the lowest frequency of the pass band of the fourth band pass filter.

FIG. 20 shows that, when the duty ratio is about 0.47 or smaller, a variation in the frequency at which stopband ripples occur is reduced and the absolute value of the return loss in the transmit band and the receive band of Band25 is smaller than about 0.9. Setting the duty ratio to be about 0.47 or smaller makes it possible to effectively reduce or prevent the degradation of the filter characteristics.

If the manufacturing variations in the electrode finger width of the IDT electrode are about ±7%, the duty ratio varies within a range of about 0.435±about 0.035 when the target duty ratio of the IDT electrode is about 0.435. When the duty ratio of the IDT electrode of the elastic wave resonator varies within this range, stopband ripples appear, as shown in FIG. 20. The bandwidth between the highest frequency of the transmit band of Band25 and the lowest frequency of the receive band of Band25 is as narrow as about 20 MHz. In this case, setting the target value of the duty ratio to be about 0.435 or smaller restricts the frequency range at which stopband ripples occur to between the highest frequency of the transmit band of Band25 and the lowest frequency of the receive band of Band25. It is thus possible to effectively reduce or prevent the degradation of the filter characteristics, such as the insertion loss, of the second band pass filter using the transmit band of Band25 as the pass band and the fourth band pass filter using the receive band of Band25 as the pass band.

An elastic wave device according to an eighth preferred embodiment of the present invention will be described below.

In the elastic wave device according to the eighth preferred embodiment, the relationship between the dielectric film 4 and the duty ratio of the IDT electrode 3 is different from that of the elastic wave device 1 of the first preferred embodiment shown in FIG. 1. Except for this point, the configuration of the elastic wave device of the eighth preferred embodiment is the same or similar to that of the first preferred embodiment.

The piezoelectric substrate used in the eighth preferred embodiment is preferably a LiNbO$_3$ substrate having a cut angle of about 127.5°, for example. The standardized film thickness of the IDT electrode is preferably about 5%, for example.

The elastic wave device of the eighth preferred embodiment preferably includes a dielectric film made of silicon oxide, for example, as in the first preferred embodiment. This makes it possible to improve the temperature characteristics of velocity (temperature coefficient velocity (TCV)). The temperature characteristics of velocity (TCV) are dependent on the duty ratio of the IDT electrode. The fractional bandwidth of the elastic wave device is also dependent on the duty ratio of the IDT electrode.

Figure 21:
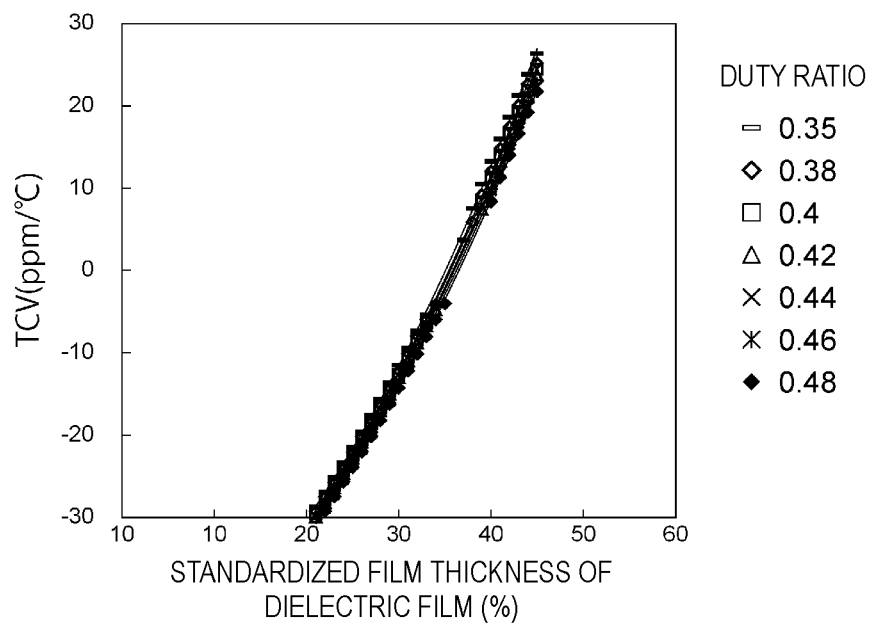
FIG. 21 is a graph illustrating the relationship among the standardized film thickness of a dielectric film, the duty ratio of an IDT electrode, and the temperature characteristics of velocity (temperature coefficient of velocity TCV)) according to an eighth preferred embodiment of the present invention.
Figure 22:
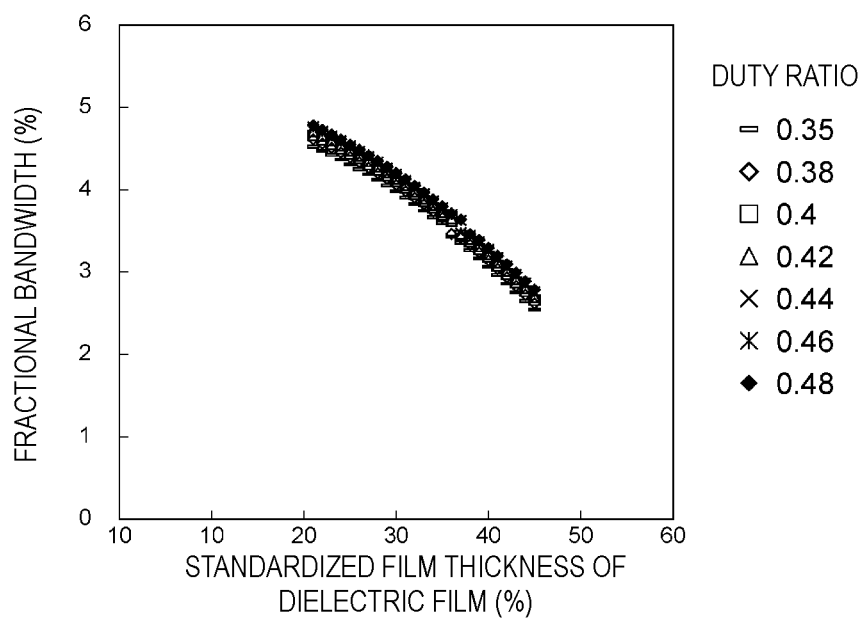
FIG. 22 is a graph illustrating the relationship among the standardized film thickness of the dielectric film, the duty ratio of the IDT electrode, and the fractional bandwidth according to the eighth preferred embodiment of the present invention.

FIG. 21 is a graph illustrating the relationship among the standardized film thickness of the dielectric film, the duty ratio of the IDT electrode, and the temperature characteristics of velocity (TCV) according to the eighth preferred embodiment. FIG. 22 is a graph illustrating the relationship among the standardized film thickness of the dielectric film, the duty ratio of the IDT electrode, and the fractional bandwidth according to the eighth preferred embodiment.

FIG. 21 shows that, as the duty ratio of the IDT electrode is smaller, the TCV is increased with respect to the same standardized film thickness of the dielectric film. On the other hand, however, FIG. 22 shows that, as the duty ratio of the IDT electrode is smaller, the fractional bandwidth is decreased with respect to the same standardized film thickness of the dielectric film.

Figure 23:
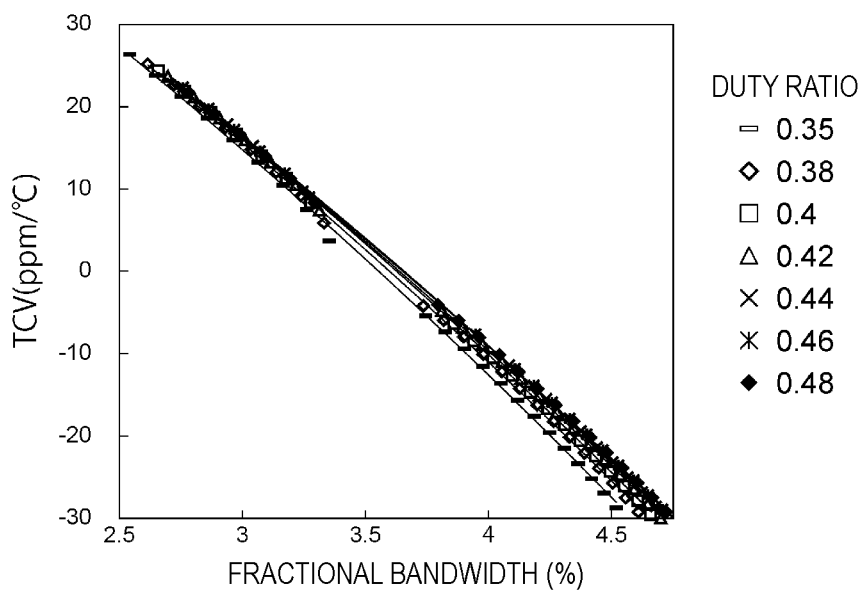
FIG. 23 is a graph illustrating the relationship between the duty ratio of the IDT electrode and a trade-off between the TCV and the fractional bandwidth according to the eighth preferred embodiment of the present invention.

FIG. 23 is a graph illustrating the relationship between the duty ratio of the IDT electrode and a trade-off between the TCV and the fractional bandwidth according to the eighth preferred embodiment.

FIG. 23 shows that the TCV and the fractional bandwidth have a trade-off relationship. As shown in FIGS. 21 and 22, when the duty ratio is smaller, the fractional bandwidth is decreased although the TCV is increased. The best trade-off relationship is achieved when the well-balanced relationship between the TCV and the fractional bandwidth is provided. When the TCV is increased with respect to the fixed fractional bandwidth, the trade-off relationship between the TCV and the fractional bandwidth is improved. When the TCV with respect to the fixed fractional bandwidth is decreased, the trade-off relationship deteriorates. The relationship between the TCV and the duty ratio with respect to the fixed fractional bandwidth is shown in FIG. 24.

Figure 24:
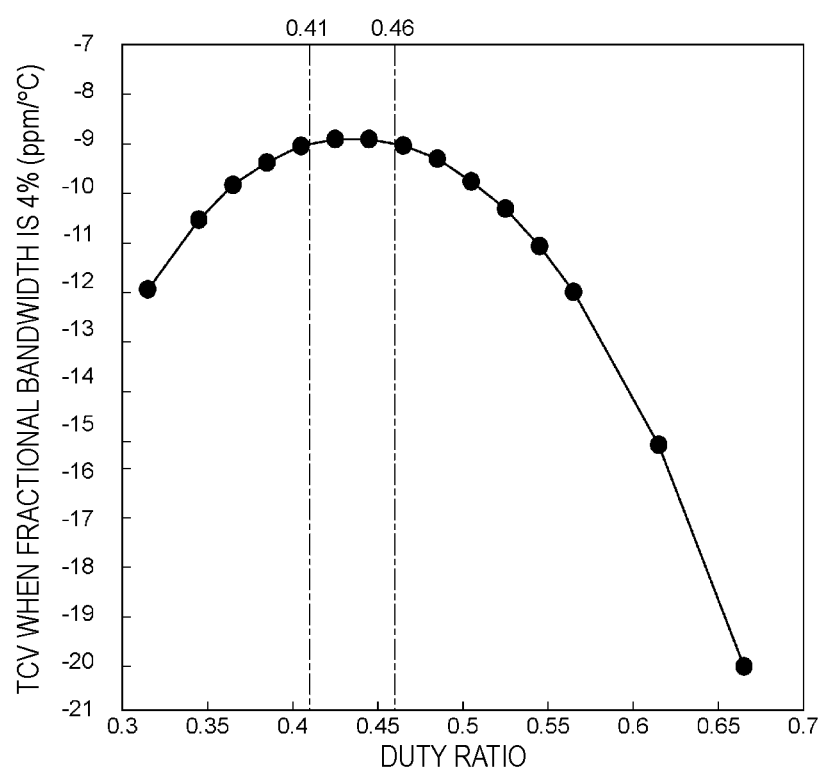
FIG. 24 is a graph illustrating the relationship between the duty ratio of the IDT electrode and the TCV when the fractional bandwidth is about 4%.

FIG. 24 is a graph illustrating the relationship between the duty ratio of the IDT electrode and the TCV when the fractional bandwidth is about 4%.

FIG. 24 shows that, as the duty ratio of the IDT electrode approaches about 0.45, the TCV is increased. The duty ratio is preferably about 0.41 to about 0.46, and more preferably, about 0.44 to about 0.46, and even more preferably, about 0.45, for example. This improves the trade-off between the TCV and the fractional bandwidth.

Additionally, as well as in the first preferred embodiment, in the eighth preferred embodiment, the duty ratio of the IDT electrode is within a range of about 0.3 to about 0.48, thus reducing a variation in the frequency at which stopband ripples occur.

The first through eighth preferred embodiments disclose an elastic wave resonator, a filter, a duplexer, and quadplexer. The elastic wave device according to each of the first through eighth preferred embodiments may be also used for a multiplexer. The multiplexer includes at least two filters, such as a duplexer, a triplexer, a quadplexer. The multiplexer may include at least a transmit filter and a receive filter, at least two transmit filters, or at least two receive filters.

In other words, the elastic wave devices according to each of the first through eighth preferred embodiments may be used for elastic wave resonators, filters, multiplexers, radio-frequency (RF) front-end circuits, and communication devices, for example. An example of the application of the elastic wave device to a communication device will be described below.

Figure 25:
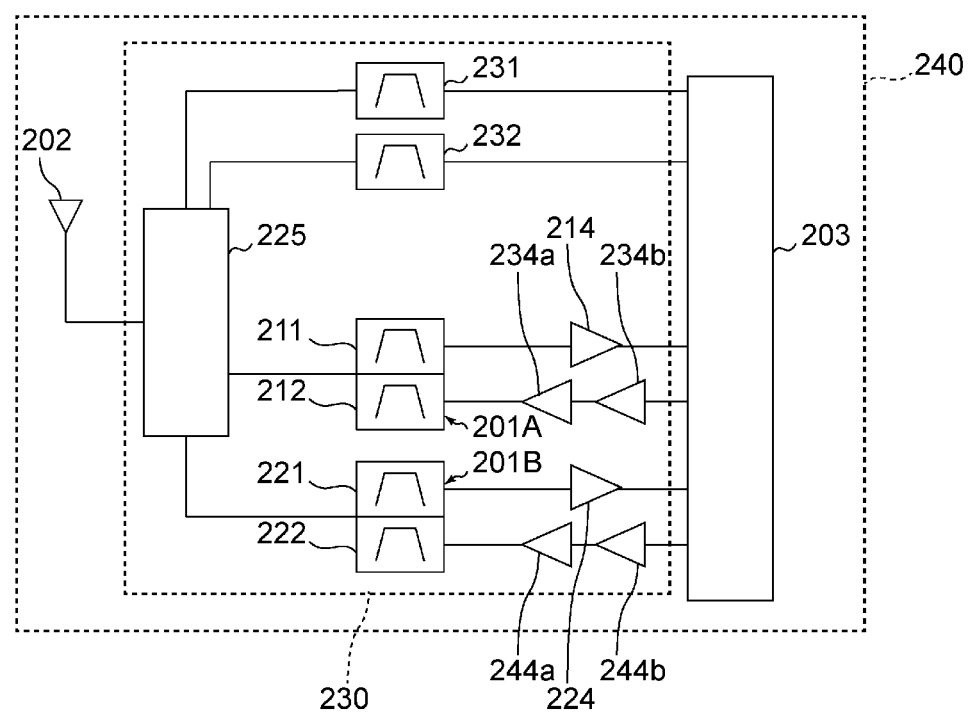
FIG. 25 is a schematic diagram of a communication device including a radio-frequency front-end circuit.

FIG. 25 is a schematic diagram of a communication device 240 according to a preferred embodiment of the present invention. The communication device 240 includes an RF front-end circuit 230, an antenna element 202, and RF signal processing circuit (RF integrated circuit (RFIC)) 203. The communication device 240 may also include a power supply source, a central processing unit (CPU), and a display.

The RF front-end circuit 230 includes a switch 225, duplexers 201A and 201B, filters 231 and 232, low-noise amplifier circuits 214 and 224, and power amplifier circuits 234a, 234b, 244a, and 244b. The RF front-end circuit 230 and the communication device 240 shown in FIG. 25 are only examples of an RF front-end circuit and a communication device and are not restricted to this configuration. For example, the RF front-end circuit 230 may include a quadplexer according to a preferred embodiment of the present invention.

The duplexer 201A includes filters 211 and 212. The duplexer 201B includes filters 221 and 222. The duplexers 201A and 201B are connected to the antenna element 202 via the switch 225. The duplexers 201A and 201B may be duplexers according to preferred embodiments of the present invention. The filters 211, 212, 221, and 222 may be filters according to preferred embodiments of the present invention. An elastic wave resonator included the filters 211, 212, 221, and 222 may be an elastic wave resonator according to a preferred embodiment of the present invention.

The switch 225 connects the antenna element 202 and a signal path corresponding to a predetermined band in accordance with a control signal from a controller (not shown). The switch 225 may preferably be a single-pole double-throw (SPDT) switch, for example. The antenna element 202 may not necessarily be connected to a single signal path, and may be connected to multiple signal paths. That is, the RF front-end circuit 230 may support carrier aggregation (CA).

The low-noise amplifier 214 is a receive amplifier circuit which amplifies an RF signal (RF received signal, in this case) received via the antenna element 202, the switch 225, and the duplexer 201A and outputs the amplified RF signal to the RF signal processing circuit 203. The low-noise amplifier 224 is a receive amplifier circuit which amplifies an RF signal (RF received signal, in this case) received via the antenna element 202, the switch 225, and the duplexer 201B and outputs the amplified RF signal to the RF signal processing circuit 203.

The power amplifier circuits 234a and 234b are transmit amplifier circuits which amplify an RF signal (RF transmit signal, in this case) output from the RF signal processing circuit 203 and output the amplified RF signal to the antenna element 202 via the duplexer 201A and the switch 225. The power amplifier circuits 244a and 244b are transmit amplifier circuits which amplify an RF signal (RF transmit signal, in this case) output from the RF signal processing circuit 203 and output the amplified RF signal to the antenna element 202 via the duplexer 201B and the switch 225.

The RF signal processing circuit 203 performs signal processing, such as down-conversion, on an RF received signal input from the antenna element 202 via a received signal path, and outputs the processed RF received signal. The RF signal processing circuit 203 also performs signal processing, such as up-conversion, on an RF transmit signal, and outputs the processed RF transmit signal to the power amplifier circuits 234a, 234b, 244a, and 244b. An example of the RF signal processing circuit 203 is an RFIC, for example. The communication device 240 may include a baseband (BB) IC. The BBIC performs signal processing on a received signal processed by the RFIC. The BBIC also performs signal processing on a transmit signal and outputs the processed transmit signal to the RFIC. A received signal processed by the BBIC and a transmit signal which has not been processed by the BBIC are image signals or audio signals, for example.

The RF front-end circuit 230 and the communication device 240 configured as described above include an elastic wave resonator, a filter, and/or a multiplexer including two or more filters configured according to a preferred embodiment of the present invention, thus making it possible to reduce a variation in the frequency at which stopband ripples occur.

Elastic wave devices, filters, multiplexers, RF front-end circuits, and communication devices have been discussed as examples of the preferred embodiments of the present invention and modified examples thereof. However, certain elements of the above-described preferred embodiments and modified examples may be combined to provide other preferred embodiments. Various modifications may be made to the preferred embodiments by those skilled in the art without departing from the scope and spirit of the invention to form modified examples. Such preferred embodiments and modified examples and also various apparatuses including FR front-end circuits or communication devices according to preferred embodiments of the present invention may also be encompassed in the present invention.

Preferred embodiments of the present invention may widely be used in communication apparatuses, such as cellular phones, for example, as elastic wave resonators, filters, multiplexers applicable to a multiband system, front-end circuits, and communication devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   an interdigital transducer electrode that is disposed on the piezoelectric substrate and that includes an electrode layer including molybdenum as a main component; and
   a dielectric film that is disposed on the piezoelectric substrate and covers the interdigital transducer electrode; wherein
   a duty ratio of the interdigital transducer electrode is about 0.3 to about 0.48; and
   in a case in which a film thickness standardized by a wavelength which is determined by an electrode finger pitch of the interdigital transducer electrode defines a standardized film thickness, the standardized film thickness of the dielectric film is about 26% or greater and about 37.5% or smaller.

2. The elastic wave device according to claim 1, wherein the duty ratio of the interdigital transducer electrode is about 0.475 or smaller.

3. The elastic wave device according to claim 2, wherein the duty ratio of the interdigital transducer electrode is about 0.47 or smaller.

4. The elastic wave device according to claim 1, wherein the duty ratio of the interdigital transducer electrode is about 0.44 to about 0.46.

5. The elastic wave device according to claim 1, wherein
   the piezoelectric substrate is made of lithium niobate;
   the dielectric film is made of silicon oxide; and
   the elastic wave device utilizes Rayleigh waves which propagate through the piezoelectric substrate.

6. A band pass filter comprising:
   the elastic wave device according to claim 1.

7. The band pass filter according to claim 6, wherein the duty ratio of the interdigital transducer electrode is about 0.475 or smaller.

8. The band pass filter according to claim 7, wherein the duty ratio of the interdigital transducer electrode is about 0.47 or smaller.

9. The band pass filter according to claim 6, wherein the duty ratio of the interdigital transducer electrode is about 0.44 to about 0.46.

10. The band pass filter according to claim 6, wherein
    the piezoelectric substrate is made of lithium niobate;
    the dielectric film is made of silicon oxide; and
    the elastic wave device utilizes Rayleigh waves which propagate through the piezoelectric substrate.

11. A multiplexer comprising:
    an antenna terminal connected to an antenna;
    the band pass filter according to claim 6 defining a first band pass filter that is connected to the antenna terminal; and
    a second band pass filter that is connected to the antenna terminal, a pass band of the second band pass filter being higher than a pass band of the first band pass filter.

12. The multiplexer according to claim 11, wherein
    the pass band of the first band pass filter is a transmit band of Band3; and
    the pass band of the second band pass filter is one of a transmit band and a receive band of Band1.

13. The multiplexer according to claim 11, wherein
    the pass band of the first band pass filter is a transmit band of Band66; and
    the pass band of the second band pass filter is one of a transmit band and a receive band of Band25.

14. A radio-frequency front-end circuit comprising:
    the elastic wave device according to claim 1; and
    a power amplifier.

15. A communication device comprising:
    the radio-frequency front-end circuit according to claim 14; and
    a radio-frequency signal processing circuit.

* * * * *